US011933822B2

(12) United States Patent
Reynaga et al.

(10) Patent No.: US 11,933,822 B2
(45) Date of Patent: Mar. 19, 2024

(54) METHODS AND SYSTEMS FOR IN-SYSTEM ESTIMATION OF ACTUATOR PARAMETERS

(71) Applicant: Cirrus Logic International Semiconductor Ltd., Edinburgh (GB)

(72) Inventors: Jorge L. Reynaga, Austin, TX (US); Marco A. Janko, Austin, TX (US); Emmanuel A. Marchais, Dripping Springs, TX (US); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 119 days.

(21) Appl. No.: 17/574,188

(22) Filed: Jan. 12, 2022

(65) Prior Publication Data

US 2022/0404398 A1 Dec. 22, 2022

Related U.S. Application Data

(60) Provisional application No. 63/211,128, filed on Jun. 16, 2021.

(51) Int. Cl.
| | | |
|---|---|---|
| *G01R 19/00* | (2006.01) | |
| *G01R 27/02* | (2006.01) | |
| *G08B 6/00* | (2006.01) | |
| *H02P 29/00* | (2016.01) | |

(52) U.S. Cl.
CPC ......... *G01R 19/0046* (2013.01); *G01R 27/02* (2013.01); *G08B 6/00* (2013.01); *H02P 29/00* (2013.01)

(58) Field of Classification Search
CPC ...... G01R 27/02; G01R 19/0046; G08B 6/00; H02P 29/00

USPC .................................................. 340/407.1
See application file for complete search history.

(56) References Cited

U.S. PATENT DOCUMENTS

| | | |
|---|---|---|
| 3,686,927 A | 8/1972 | Scharton |
| 4,902,136 A | 2/1990 | Mueller et al. |
| 5,374,896 A | 12/1994 | Sato et al. |
| 5,684,722 A | 11/1997 | Thorner et al. |

(Continued)

FOREIGN PATENT DOCUMENTS

| | | |
|---|---|---|
| AU | 2002347829 | 4/2003 |
| CN | 103165328 A | 6/2013 |

(Continued)

OTHER PUBLICATIONS

Combined Search and Examination Report under Sections 17 and 18(3), UKIPO, Application No. GB2210174.5, dated Aug. 1, 2022.

(Continued)

*Primary Examiner* — Jack K Wang
(74) *Attorney, Agent, or Firm* — Jackson Walker L.L.P.

(57) ABSTRACT

A method for estimating actuator parameters for an actuator, in-situ and in real-time, may include driving the actuator with a test signal imperceptible to a user of a device comprising the actuator during real-time operation of the device, measuring a voltage and a current associated with the actuator and caused by the test signal, determining one or more parameters of the actuator based on the voltage and the current, determining an actuator type of the actuator based on the one or more parameters, and controlling a playback signal to the actuator based on the actuator type.

20 Claims, 7 Drawing Sheets

(56) References Cited

U.S. PATENT DOCUMENTS

| | | |
|---|---|---|
| 5,748,578 A | 5/1998 | Schell |
| 5,857,986 A | 1/1999 | Moriyasu |
| 6,050,393 A | 4/2000 | Murai et al. |
| 6,278,790 B1 | 8/2001 | Davis et al. |
| 6,294,891 B1 | 9/2001 | McConnell et al. |
| 6,332,029 B1 | 12/2001 | Azima et al. |
| 6,388,520 B2 | 5/2002 | Wada et al. |
| 6,567,478 B2 | 5/2003 | Oishi et al. |
| 6,580,796 B1 | 6/2003 | Kuroki |
| 6,683,437 B2 | 1/2004 | Tierling |
| 6,703,550 B2 | 3/2004 | Chu |
| 6,762,745 B1 | 7/2004 | Braun et al. |
| 6,768,779 B1 | 7/2004 | Nielsen |
| 6,784,740 B1 | 8/2004 | Tabatabaei |
| 6,816,833 B1 | 11/2004 | Iwamoto et al. |
| 6,906,697 B2 | 6/2005 | Rosenberg |
| 6,995,747 B2 | 2/2006 | Casebolt et al. |
| 7,042,286 B2 | 5/2006 | Meade et al. |
| 7,154,470 B2 | 12/2006 | Tierling |
| 7,277,678 B2 | 10/2007 | Rozenblit et al. |
| 7,333,604 B2 | 2/2008 | Zernovizky et al. |
| 7,392,066 B2 | 6/2008 | Japarnas |
| 7,456,688 B2 | 11/2008 | Okazaki et al. |
| 7,623,114 B2 | 11/2009 | Rank |
| 7,639,232 B2 | 12/2009 | Grant et al. |
| 7,777,566 B1 | 8/2010 | Drogi et al. |
| 7,791,588 B2 | 9/2010 | Tierling et al. |
| 7,825,838 B1 | 11/2010 | Srinivas et al. |
| 7,979,146 B2 | 7/2011 | Ullrich et al. |
| 8,068,025 B2 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,441,444 B2 | 5/2013 | Moore et al. |
| 8,466,778 B2 | 6/2013 | Wang et al. |
| 8,480,240 B2 | 7/2013 | Kashiyama |
| 8,572,293 B2 | 10/2013 | Cruz-Hernandez et al. |
| 8,572,296 B2 | 10/2013 | Shasha et al. |
| 8,593,269 B2 | 11/2013 | Grant et al. |
| 8,648,659 B2 | 2/2014 | Oh et al. |
| 8,648,829 B2 | 2/2014 | Shahoian et al. |
| 8,659,208 B1 | 2/2014 | Rose et al. |
| 8,754,757 B1 | 6/2014 | Ullrich et al. |
| 8,754,758 B1 | 6/2014 | Ullrich et al. |
| 8,947,216 B2 | 2/2015 | Da Costa et al. |
| 8,981,915 B2 | 3/2015 | Birnbaum et al. |
| 8,994,518 B2 | 3/2015 | Gregorio et al. |
| 9,019,087 B2 | 4/2015 | Bakircioglu et al. |
| 9,030,428 B2 | 5/2015 | Fleming |
| 9,063,570 B2 | 6/2015 | Weddle et al. |
| 9,070,856 B1 | 6/2015 | Rose et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,326,066 B2 | 4/2016 | Kilppel |
| 9,329,721 B1 * | 5/2016 | Buuck .................. G06F 3/04184 |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,495,013 B2 | 11/2016 | Underkoffler et al. |
| 9,507,423 B2 | 11/2016 | Gandhi et al. |
| 9,513,709 B2 | 12/2016 | Gregorio et al. |
| 9,520,036 B1 | 12/2016 | Buuck |
| 9,588,586 B2 | 3/2017 | Rihn |
| 9,640,047 B2 | 5/2017 | Choi et al. |
| 9,652,041 B2 | 5/2017 | Jiang et al. |
| 9,696,859 B1 | 7/2017 | Heller et al. |
| 9,697,450 B1 | 7/2017 | Lee |
| 9,715,300 B2 | 7/2017 | Sinclair et al. |
| 9,740,381 B1 | 8/2017 | Chaudhri et al. |
| 9,842,476 B2 | 12/2017 | Rihn et al. |
| 9,864,567 B2 | 1/2018 | Seo |
| 9,881,467 B2 | 1/2018 | Levesque |
| 9,886,829 B2 | 2/2018 | Levesque |
| 9,946,348 B2 | 4/2018 | Ullrich et al. |
| 9,947,186 B2 | 4/2018 | Macours |
| 9,959,744 B2 | 5/2018 | Koskan et al. |
| 9,965,092 B2 | 5/2018 | Smith |
| 10,032,550 B1 | 7/2018 | Zhang et al. |
| 10,039,080 B2 | 7/2018 | Miller et al. |
| 10,055,950 B2 | 8/2018 | Saboune et al. |
| 10,074,246 B2 | 9/2018 | Da Costa et al. |
| 10,082,873 B2 | 9/2018 | Zhang |
| 10,102,722 B2 | 10/2018 | Levesque et al. |
| 10,110,152 B1 | 10/2018 | Hajati |
| 10,165,358 B2 | 12/2018 | Koudar et al. |
| 10,171,008 B2 | 1/2019 | Nishitani et al. |
| 10,175,763 B2 | 1/2019 | Shah |
| 10,191,579 B2 | 1/2019 | Forlines et al. |
| 10,264,348 B1 | 4/2019 | Harris et al. |
| 10,275,087 B1 | 4/2019 | Smith |
| 10,402,031 B2 | 9/2019 | Vandermeijden et al. |
| 10,564,727 B2 | 2/2020 | Billington et al. |
| 10,620,704 B2 | 4/2020 | Rand et al. |
| 10,667,051 B2 | 5/2020 | Stahl |
| 10,726,683 B1 | 7/2020 | Mondello et al. |
| 10,735,956 B2 | 8/2020 | Bae et al. |
| 10,782,785 B2 | 9/2020 | Hu et al. |
| 10,795,443 B2 | 10/2020 | Hu et al. |
| 10,820,100 B2 | 10/2020 | Stahl et al. |
| 10,828,672 B2 | 11/2020 | Stahl et al. |
| 10,832,537 B2 | 11/2020 | Doy et al. |
| 10,841,696 B2 | 11/2020 | Mamou-Mani |
| 10,848,886 B2 | 11/2020 | Rand |
| 10,860,202 B2 | 12/2020 | Sepehr et al. |
| 10,955,955 B2 | 3/2021 | Peso Parada et al. |
| 10,969,871 B2 | 4/2021 | Rand et al. |
| 10,976,825 B2 | 4/2021 | Das et al. |
| 11,069,206 B2 | 7/2021 | Rao et al. |
| 11,079,874 B2 | 8/2021 | Lapointe et al. |
| 11,139,767 B2 | 10/2021 | Janko et al. |
| 11,150,733 B2 | 10/2021 | Das et al. |
| 11,259,121 B2 | 2/2022 | Lindemann et al. |
| 11,460,526 B1 | 10/2022 | Foo et al. |
| 11,500,469 B2 | 11/2022 | Rao et al. |
| 2001/0043714 A1 | 11/2001 | Asada et al. |
| 2002/0018578 A1 | 2/2002 | Burton |
| 2002/0085647 A1 | 7/2002 | Oishi et al. |
| 2003/0068053 A1 | 4/2003 | Chu |
| 2003/0214485 A1 | 11/2003 | Roberts |
| 2005/0031140 A1 | 2/2005 | Browning |
| 2005/0134562 A1 | 6/2005 | Grant et al. |
| 2005/0195919 A1 | 9/2005 | Cova |
| 2006/0028095 A1 | 2/2006 | Maruyama et al. |
| 2006/0197753 A1 | 9/2006 | Hotelling |
| 2007/0013337 A1 | 1/2007 | Liu et al. |
| 2007/0024254 A1 | 2/2007 | Radecker et al. |
| 2007/0241816 A1 | 10/2007 | Okazaki et al. |
| 2008/0077367 A1 | 3/2008 | Odajima |
| 2008/0226109 A1 | 9/2008 | Yamakata et al. |
| 2008/0240458 A1 | 10/2008 | Goldstein et al. |
| 2008/0293453 A1 | 11/2008 | Atlas et al. |
| 2008/0316181 A1 | 12/2008 | Nurmi |
| 2009/0020343 A1 | 1/2009 | Rothkopf et al. |
| 2009/0079690 A1 | 3/2009 | Watson et al. |
| 2009/0088220 A1 | 4/2009 | Persson |
| 2009/0096632 A1 | 4/2009 | Ullrich et al. |
| 2009/0102805 A1 | 4/2009 | Meijer et al. |
| 2009/0128306 A1 | 5/2009 | Luden et al. |
| 2009/0153499 A1 | 6/2009 | Kim et al. |
| 2009/0189867 A1 | 7/2009 | Krah |
| 2009/0278819 A1 | 11/2009 | Goldenberg et al. |
| 2009/0279719 A1 | 11/2009 | Lesso |
| 2009/0313542 A1 | 12/2009 | Cruz-Hernandez et al. |
| 2010/0013761 A1 | 1/2010 | Birnbaum et al. |
| 2010/0080331 A1 | 4/2010 | Garudadri et al. |
| 2010/0085317 A1 | 4/2010 | Park et al. |
| 2010/0141408 A1 | 6/2010 | Doy et al. |
| 2010/0141606 A1 | 6/2010 | Bae et al. |

(56) References Cited

U.S. PATENT DOCUMENTS

| | | |
|---|---|---|
| 2010/0260371 A1 | 10/2010 | Afshar |
| 2010/0261526 A1 | 10/2010 | Anderson et al. |
| 2010/0331685 A1 | 12/2010 | Stein et al. |
| 2011/0056763 A1 | 3/2011 | Tanase et al. |
| 2011/0075835 A1 | 3/2011 | Hill |
| 2011/0077055 A1 | 3/2011 | Pakula et al. |
| 2011/0141052 A1 | 6/2011 | Bernstein et al. |
| 2011/0161537 A1 | 6/2011 | Chang |
| 2011/0163985 A1 | 7/2011 | Bae et al. |
| 2011/0167391 A1* | 7/2011 | Momeyer ............... G06F 3/038 715/863 |
| 2012/0011436 A1 | 1/2012 | Jinkinson et al. |
| 2012/0105358 A1 | 5/2012 | Momeyer et al. |
| 2012/0105367 A1 | 5/2012 | Son et al. |
| 2012/0112894 A1 | 5/2012 | Yang et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0249462 A1 | 10/2012 | Flanagan et al. |
| 2012/0253698 A1 | 10/2012 | Cokonaj |
| 2012/0306631 A1 | 12/2012 | Hughes |
| 2013/0016855 A1 | 1/2013 | Lee et al. |
| 2013/0027359 A1 | 1/2013 | Schevin et al. |
| 2013/0038792 A1 | 2/2013 | Quigley et al. |
| 2013/0096849 A1 | 4/2013 | Campbell et al. |
| 2013/0141382 A1 | 6/2013 | Simmons et al. |
| 2013/0275058 A1 | 10/2013 | Awad |
| 2013/0289994 A1 | 10/2013 | Newman et al. |
| 2013/0307786 A1 | 11/2013 | Heubel |
| 2014/0035736 A1 | 2/2014 | Weddle et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0085064 A1 | 3/2014 | Crawley et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0125467 A1 | 5/2014 | Da Costa et al. |
| 2014/0139327 A1 | 5/2014 | Bau et al. |
| 2014/0176415 A1 | 6/2014 | Buuck et al. |
| 2014/0205260 A1 | 7/2014 | Lacroix et al. |
| 2014/0222377 A1 | 8/2014 | Bitan et al. |
| 2014/0226068 A1 | 8/2014 | Lacroix et al. |
| 2014/0253303 A1 | 9/2014 | Levesque |
| 2014/0292501 A1 | 10/2014 | Lim et al. |
| 2014/0300454 A1 | 10/2014 | Lacroix et al. |
| 2014/0340209 A1 | 11/2014 | Lacroix et al. |
| 2014/0347176 A1 | 11/2014 | Modarres et al. |
| 2015/0010176 A1 | 1/2015 | Scheveiw et al. |
| 2015/0201294 A1 | 1/2015 | Risberg et al. |
| 2015/0049882 A1 | 2/2015 | Chiu et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070154 A1 | 3/2015 | Levesque et al. |
| 2015/0070260 A1 | 3/2015 | Saboune et al. |
| 2015/0077324 A1 | 3/2015 | Birnbaum et al. |
| 2015/0084752 A1 | 3/2015 | Heubel et al. |
| 2015/0116205 A1 | 4/2015 | Westerman et al. |
| 2015/0130767 A1 | 5/2015 | Myers et al. |
| 2015/0204925 A1 | 7/2015 | Hernandez et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0249888 A1 | 9/2015 | Bogdanov |
| 2015/0264455 A1 | 9/2015 | Granoto et al. |
| 2015/0268768 A1 | 9/2015 | Woodhull et al. |
| 2015/0324116 A1 | 11/2015 | Marsden et al. |
| 2015/0325116 A1 | 11/2015 | Umminger, III |
| 2015/0339898 A1 | 11/2015 | Saboune et al. |
| 2015/0341714 A1 | 11/2015 | Ahn et al. |
| 2015/0356981 A1 | 12/2015 | Johnson et al. |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070353 A1 | 3/2016 | Lacroix et al. |
| 2016/0070392 A1 | 3/2016 | Wang et al. |
| 2016/0074278 A1 | 3/2016 | Muench et al. |
| 2016/0097662 A1 | 4/2016 | Chang et al. |
| 2016/0132118 A1 | 5/2016 | Park et al. |
| 2016/0155305 A1 | 6/2016 | Barsilai et al. |
| 2016/0162031 A1* | 6/2016 | Westerman ......... G06F 3/04847 345/173 |
| 2016/0179203 A1* | 6/2016 | Modarres ................. G08B 6/00 340/407.1 |
| 2016/0187987 A1 | 6/2016 | Ulrich et al. |
| 2016/0227614 A1 | 8/2016 | Lissoni et al. |
| 2016/0239089 A1 | 8/2016 | Taninaka et al. |
| 2016/0246378 A1 | 8/2016 | Sampanes et al. |
| 2016/0277821 A1 | 9/2016 | Kunimoto |
| 2016/0291731 A1 | 10/2016 | Liu et al. |
| 2016/0305996 A1 | 10/2016 | Martens et al. |
| 2016/0328065 A1 | 11/2016 | Johnson et al. |
| 2016/0358605 A1 | 12/2016 | Ganong, III et al. |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0097381 A1 | 4/2017 | Stephens et al. |
| 2017/0153760 A1 | 6/2017 | Chawda et al. |
| 2017/0168574 A1 | 6/2017 | Zhang |
| 2017/0168773 A1 | 6/2017 | Keller et al. |
| 2017/0169674 A1 | 6/2017 | Macours |
| 2017/0180863 A1 | 6/2017 | Biggs et al. |
| 2017/0220197 A1 | 8/2017 | Matsumoto et al. |
| 2017/0256145 A1 | 9/2017 | Macours et al. |
| 2017/0277350 A1 | 9/2017 | Wang et al. |
| 2017/0277360 A1* | 9/2017 | Breedvelt-Schouten .................... G06F 3/013 |
| 2017/0031495 A1 | 12/2017 | Tse |
| 2017/0357440 A1 | 12/2017 | Tse |
| 2018/0021811 A1 | 1/2018 | Kutej et al. |
| 2018/0033946 A1 | 2/2018 | Kemppinen et al. |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1 | 3/2018 | Tzanetos |
| 2018/0084362 A1 | 3/2018 | Zhang et al. |
| 2018/0095596 A1 | 4/2018 | Turgeman |
| 2018/0139538 A1 | 5/2018 | Macours |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |
| 2018/0159545 A1 | 6/2018 | Eke et al. |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1* | 6/2018 | Li ............... G06F 3/016 |
| 2018/0183372 A1* | 6/2018 | Li ............... G06F 3/016 |
| 2018/0194369 A1 | 7/2018 | Lisseman et al. |
| 2018/0196567 A1 | 7/2018 | Klein et al. |
| 2018/0224963 A1 | 8/2018 | Lee et al. |
| 2018/0227063 A1 | 8/2018 | Heubel et al. |
| 2018/0237033 A1 | 8/2018 | Hakeem et al. |
| 2018/0206282 A1 | 9/2018 | Singh |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0294757 A1* | 10/2018 | Feng ............ G06F 3/016 |
| 2018/0301060 A1 | 10/2018 | Israr et al. |
| 2018/0304310 A1 | 10/2018 | Long et al. |
| 2018/0321056 A1 | 11/2018 | Yoo et al. |
| 2018/0321748 A1 | 11/2018 | Rao et al. |
| 2018/0323725 A1 | 11/2018 | Cox et al. |
| 2018/0329172 A1* | 11/2018 | Tabuchi ............ H02P 6/26 |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0033348 A1 | 1/2019 | Zeleznik et al. |
| 2019/0035235 A1 | 1/2019 | Da Costa et al. |
| 2019/0227628 A1 | 1/2019 | Rand et al. |

(56) References Cited

U.S. PATENT DOCUMENTS

| | | |
|---|---|---|
| 2019/0044651 A1 | 2/2019 | Nakada |
| 2019/0051229 A1 | 2/2019 | Ozguner et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0102031 A1 | 4/2019 | Shutzberg et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0253031 A1 | 8/2019 | Vellanki et al. |
| 2019/0294247 A1 | 9/2019 | Hu et al. |
| 2019/0295755 A1 | 9/2019 | Konradi et al. |
| 2019/0296674 A1 | 9/2019 | Janko et al. |
| 2019/0297418 A1 | 9/2019 | Stahl |
| 2019/0305851 A1 | 10/2019 | Vegas-Olmos et al. |
| 2019/0311590 A1 | 10/2019 | Doy et al. |
| 2019/0341903 A1 | 11/2019 | Kim |
| 2019/0384393 A1 | 12/2019 | Cruz-Hernandez et al. |
| 2019/0384898 A1 | 12/2019 | Chen et al. |
| 2020/0117506 A1 | 4/2020 | Chan |
| 2020/0139403 A1 | 5/2020 | Palit |
| 2020/0150767 A1 | 5/2020 | Karimi Eskandary et al. |
| 2020/0218352 A1 | 7/2020 | Macours et al. |
| 2020/0231085 A1 | 7/2020 | Kunii et al. |
| 2020/0306796 A1 | 10/2020 | Lindemann et al. |
| 2020/0313529 A1 | 10/2020 | Lindemann |
| 2020/0313654 A1 | 10/2020 | Marchais et al. |
| 2020/0314969 A1 | 10/2020 | Marchais et al. |
| 2020/0342724 A1 | 10/2020 | Marchais et al. |
| 2020/0348249 A1 | 11/2020 | Marchais et al. |
| 2020/0395908 A1 | 12/2020 | Schindler et al. |
| 2020/0403546 A1 | 12/2020 | Janko et al. |
| 2021/0108975 A1 | 4/2021 | Parada et al. |
| 2021/0125469 A1 | 4/2021 | Alderson |
| 2021/0153562 A1 | 5/2021 | Fishwick et al. |
| 2021/0157436 A1 | 5/2021 | Peso Parada et al. |
| 2021/0174777 A1* | 6/2021 | Marchais ............. G10K 9/13 |
| 2021/0175869 A1 | 6/2021 | Taipale |
| 2021/0200316 A1 | 7/2021 | Das et al. |
| 2021/0325967 A1 | 10/2021 | Khenkin et al. |
| 2021/0328535 A1 | 10/2021 | Khenkin et al. |
| 2021/0360347 A1 | 11/2021 | Aschieri |
| 2021/0365118 A1 | 11/2021 | Rajapurkar et al. |
| 2022/0026989 A1 | 1/2022 | Rao et al. |
| 2022/0328752 A1 | 10/2022 | Lesso et al. |
| 2022/0404398 A1 | 12/2022 | Reynaga et al. |
| 2022/0408181 A1 | 12/2022 | Hendrix et al. |

FOREIGN PATENT DOCUMENTS

| | | |
|---|---|---|
| CN | 104811838 A | 7/2015 |
| CN | 204903757 U | 12/2015 |
| CN | 105264551 A | 1/2016 |
| CN | 106438890 A | 2/2017 |
| CN | 106950832 A | 7/2017 |
| CN | 107665051 A | 2/2018 |
| CN | 107835968 A | 3/2018 |
| CN | 210628147 U | 5/2020 |
| CN | 113268138 A | 8/2021 |
| CN | 114237414 A | 3/2022 |
| EP | 0784844 B1 | 6/2005 |
| EP | 2306269 A1 | 4/2011 |
| EP | 2363785 A1 | 9/2011 |
| EP | 2487780 A1 | 8/2012 |
| EP | 2600225 A1 | 6/2013 |
| EP | 2846218 A1 | 3/2015 |
| EP | 2846229 A2 | 3/2015 |
| EP | 2846329 A1 | 3/2015 |
| EP | 2988528 A1 | 2/2016 |
| EP | 3125508 A1 | 2/2017 |
| EP | 3379382 A1 | 9/2018 |
| EP | 3546035 A1 | 10/2019 |
| GB | 201620746 A | 1/2017 |
| GB | 2526881 B | 10/2017 |
| IN | 103403796 A | 7/2017 |
| IN | 201747044027 | 8/2018 |
| JP | H02130433 B2 | 5/1990 |
| JP | 08149006 A | 6/1996 |
| JP | H10184782 A | 7/1998 |
| JP | 6026751 B2 | 11/2016 |
| JP | 6250985 | 12/2017 |
| JP | 6321351 | 5/2018 |
| KR | 20120126446 A | 11/2012 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017034973 A1 | 3/2017 |
| WO | 2017113651 A1 | 7/2017 |
| WO | 2017113652 A1 | 7/2017 |
| WO | 2018053159 A1 | 3/2018 |
| WO | 2018067613 A1 | 4/2018 |
| WO | 2018125347 A1 | 7/2018 |
| WO | 2020004840 A1 | 1/2020 |
| WO | 2020055405 A1 | 3/2020 |

OTHER PUBLICATIONS

Examination Report under Section 18(3), UKIPO, Application No. GB2112207.2, dated Aug. 18, 2022.
International Search Report and Written Opinion of the International Searching Authority, International Application No. PCT/US2022/030541, dated Sep. 1, 2022.
Vanderborght, B. et al., Variable impedance actuators: A review; Robotics and Autonomous Systems 61, Aug. 6, 2013, pp. 1601-1614.
International Search Report and Written Opinion of the International Searching Authority, International Application No. PCT/US2022/033190, dated Sep. 8, 2022.
International Search Report and Written Opinion of the International Searching Authority, International Application No. PCT/US2022/033230, dated Sep. 15, 2022.
Examination Report under Section 18(3), UKIPO, Application No. GB2115048.7, dated Aug. 24, 2022.
Communication pursuant to Article 94(3) EPC, European Patent Office, Application No. 18727512.8, dated Sep. 26, 2022.
Examination Report under Section 18(3), UKIPO, Application No. GB2112207.2, dated Nov. 7, 2022.
Examination Report, Intellectual Property India, Application No. 202117019138, dated Jan. 4, 2023.
Search Report, China National Intellectual Property Administration, Application No. 2019107179621, dated Jan. 11, 2023.
First Office Action, China National Intellectual Property Administration, Application No. 2019107179621, dated Jan. 19, 2023.
Examination Report under Section 18(3), UKIPO, Application No. GB2113228.7, dated Feb. 10, 2023.
Examination Report under Section 18(3), UKIPO, Application No. GB2113154.5, dated Feb. 17, 2023.
Invitation to Pay Additional Fees, Partial International Search Report and Provisional Opinion of the International Searching Authority, International Application No. PCT/US2020/052537, dated Jan. 14, 2021.
International Search Report and Written Opinion of the International Searching Authority, International Application No. PCT/GB2020/052537, dated Mar. 9, 2021.
Office Action of the Intellectual Property Office, ROC (Taiwan) Patent Application No. 107115475, dated Apr. 30, 2021.
First Office Action, China National Intellectual Property Administration, Patent Application No. 2019800208570, dated Jun. 3, 2021.

(56) References Cited

OTHER PUBLICATIONS

International Search Report and Written Opinion of the International Searching Authority, International Application No. PCT/US2021/021908, dated Jun. 9, 2021.
Notice of Preliminary Rejection, Korean Intellectual Property Office, Application No. 10-2019-7036236, dated Jun. 29, 2021.
Combined Search and Examination Report, United Kingdom Intellectual Property Office, Application No. GB2018051.9, dated Jun. 30, 2021.
Communication pursuant to Rule 164(2)(b) and Article 94(3) EPC, European Patent Office, Application No. 18727512.8, dated Jul. 8, 2021.
Gottfried Behler: "Measuring the Loudspeaker's Impedance during Operation for the Derivation of the Voice Coil Temperature", AES Convention Preprint, Feb. 25, 1995 (Feb. 25, 1995), Paris.
First Office Action, China National Intellectual Property Administration, Patent Application No. 2019800211287, dated Jul. 5, 2021.
Steinbach et al., Haptic Data Compression and Communication, IEEE Signal Processing Magazine, Jan. 2011.
Pezent et al., Syntacts Open-Source Software and Hardware for Audio-Controlled Haptics, IEEE Transactions on Haptics, vol. 14, No. 1, Jan.-Mar. 2021.
Examination Report under Section 18(3), United Kingdom Intellectual Property Office, Application No. GB2018051.9, dated Nov. 5, 2021.
Jaijongrak et al., A Haptic and Auditory Assistive User Interface: Helping the Blinds on their Computer Operations, 2011 IEEE International Conference on Rehabilitation Robotics, Rehab Week Zurich, ETH Zurich Science City, Switzerland, Jun. 29-Jul. 1, 2011.
Lim et al., An Audio-Haptic Feedbacks for Enhancing User Experience in Mobile Devices, 2013 IEEE International Conference on Consumer Electronics (ICCE).
Weddle et al., How Does Audio-Haptic Enhancement Influence Emotional Response to Mobile Media, 2013 Fifth International Workshop on Quality of Multimedia Experience (QoMEX), QMEX 2013.
Danieau et al., Enhancing Audiovisual Experience with Haptic Feedback: A Survey on HAV, IEEE Transactions on Haptics, vol. 6, No. 2, Apr.-Jun. 2013.
Danieau et al., Toward Haptic Cinematography: Enhancing Movie Experiences with Camera-Based Haptic Effects, IEEE Computer Society, IEEE MultiMedia, Apr.-Jun. 2014.
Final Notice of Preliminary Rejection, Korean Patent Office, Application No. 10-2019-7036236, dated Nov. 29, 2021.
Examination Report under Section 18(3), United Kingdom Intellectual Property Office, Application No. GB2018050.1, dated Dec. 22, 2021.
Second Office Action, National Intellectual Property Administration, PRC, Application No. 2019800208570, dated Jan. 19, 2022.
International Search Report and Written Opinion of the International Searching Authority, International Application No. PCT/GB2019/050964, dated Sep. 3, 2019.
International Search Report and Written Opinion of the International Searching Authority, International Application No. PCT/GB2019/050770, dated Jul. 5, 2019.
Communication Relating to the Results of the Partial International Search, and Provisional Opinion Accompanying the Partial Search Result, of the International Searching Authority, International Application No. PCT/US2018/031329, dated Jul. 20, 2018.
Combined Search and Examination Report, UKIPO, Application No. GB1720424.9, dated Jun. 5, 2018.
International Search Report and Written Opinion of the International Searching Authority, International Application No. PCT/GB2019/052991, dated Mar. 17, 2020, received by Applicant Mar. 19, 2020.
Communication Relating to the Results of the Partial International Search, and Provisional Opinion Accompanying the Partial Search Result, of the International Searching Authority, International Application No. PCT/GB2020/050822, dated Jul. 9, 2020.
International Search Report and Written Opinion of the International Searching Authority, International Application No. PCT/US2020/024864, dated Jul. 6, 2020.
International Search Report and Written Opinion of the International Searching Authority, International Application No. PCT/GB2020/051035, dated Jul. 10, 2020.
International Search Report and Written Opinion of the International Searching Authority, International Application No. PCT/GB2020/050823, dated Jun. 30, 2020.
International Search Report and Written Opinion of the International Searching Authority, International Application No. PCT/GB2020/051037, dated Jul. 9, 2020.
International Search Report and Written Opinion of the International Searching Authority, International Application No. PCT/GB2020/050822, dated Aug. 31, 2020.
International Search Report and Written Opinion of the International Searching Authority, International Application No. PCT/GB2020/051438, dated Sep. 28, 2020.
First Examination Opinion Notice, State Intellectual Property Office of the People's Republic of China, Application No. 201880037435.X, dated Dec. 31, 2020.
International Search Report and Written Opinion of the International Searching Authority, International Application No. PCT/US2020/056610, dated Jan. 21, 2021.
Examination Report under Section 18(3), UKIPO, Application No. GB2117488.3, dated Apr. 27, 2023.
Examination Report under Section 18(3), United Kingdom Intellectual Property Office, Application No. GB2106247.6, dated Mar. 31, 2022.
Second Office Action, National Intellectual Property Administration, PRC, Application No. 2019107179621, dated May 24, 2023.
Examination Report under Section 18(3), UKIPO, Application No. GB2113228.7, dated Jun. 28, 2023.
Combined Search and Examination Report under Sections 17 and 18(3), UKIPO, Application No. GB2204956.3, dated Jul. 24, 2023.
Notice of Preliminary Rejection, Korean Intellectual Property Office, Application No. 10-2023-7029306, dated Sep. 19, 2023.

* cited by examiner

METHODS AND SYSTEMS FOR IN-SYSTEM ESTIMATION OF ACTUATOR PARAMETERS

RELATED APPLICATION

The present disclosure claims priority to U.S. Provisional Patent Application Ser. No. 63/211,128, filed Jun. 16, 2021, which is incorporated by reference herein in its entirety.

FIELD OF DISCLOSURE

The present disclosure relates in general to in-system detection of parameters associated with an electromagnetic actuator, such as a linear resonant actuator or haptic transducer.

BACKGROUND

Vibro-haptic transducers, for example linear resonant actuators (LRAs), are widely used in portable devices such as mobile phones to generate vibrational feedback a user. Vibro-haptic feedback in various forms creates different feelings of touch to a user's skin, and may play increasing roles in human-machine interactions for modern devices.

An LRA may be modelled as a mass-spring electro-mechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch replace mechanical buttons.

FIG. 1 illustrates an example of a vibro-haptic system in a device 100. Device 100 may comprise a controller 101 configured to control a signal applied to an amplifier 102. Amplifier 102 may then drive a haptic transducer 103 based on the signal. Controller 101 may be triggered by a trigger to output the signal. The trigger may for example comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2*\pi*\sqrt{C*M}} \quad (1)$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, component changes caused by self-heating, and use conditions such as various different strengths of a user gripping of the device, the vibration resonance of the haptic transducer may vary from time to time.

FIG. 2A illustrates an example of a linear resonant actuator (LRA) modelled as a linear system including a mass-spring system 201. LRAs are non-linear components that may behave differently depending on, for example, the voltage levels applied, the operating temperature, and the frequency of operation. However, these components may be modelled as linear components within certain conditions.

FIG. 2B illustrates an example of an LRA modelled as a linear system, including an electrically equivalent model of mass-spring system 201 of LRA. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance Ro. The terminal voltage $V_T(t)$ may be sensed across the terminals of the haptic transducer. The mass-spring system 201 moves with velocity u(t).

An electromagnetic load such as an LRA may be characterized by its impedance $Z_{LRA}$ as seen as the sum of a coil impedance $Z_{coil}$ and a mechanical impedance $Z_{mech}$:

$$Z_{LRA} = Z_{coil} + Z_{mech} \quad (2)$$

Coil impedance $Z_{coil}$ may in turn comprise a direct current (DC) resistance Re in series with an inductance Le:

$$Z_{coil} = Re + s*Le \quad (3)$$

Mechanical impedance $Z_{mech}$ may be defined by three parameters including the resistance at resonance Res representing an electrical resistance representative of mechanical friction of the mass-spring system of the haptic transducer, a capacitance Cmes representing an electrical capacitance representative of an equivalent moving mass M of the mass-spring system of the haptic transducer, and inductance Lees representative of a compliance C of the mass-spring system of the haptic transducer. The electrical equivalent of the total mechanical impedance is the parallel connection of Res, Cmes, Lees. The Laplace transform of this parallel connection is described by:

$$Z_{mech}(s) = \frac{1}{\left(\frac{1}{Res} + \frac{1}{Lces*s} + Cmes*s\right)} \quad (4)$$

The resonant frequency $f_0$ of the haptic transducer can be represented as:

$$f_0 = \frac{1}{(2*\pi*\sqrt{Lces*Cmes})} \quad (5)$$

The quality factor Q of the LRA can be represented as:

$$Q = \frac{Res*Re}{Res+Re} * \sqrt{\frac{Cmes}{Lces}} \quad (6)$$

Referring to equation (6), it may appear non-intuitive that the expression involves a subexpression describing the parallel connection of resistances Re and Res $$\left(\text{i.e., } \frac{Res*Re}{Res+Re}\right)$$

while in FIG. 2B these resistances are shown in a series connection.

However, such may be the case where a driving voltage Ve is oscillating but then abruptly turns off and goes to zero. The voltage amplifier shown in FIG. 2B may be considered to have a low source impedance, ideally zero source impedance. Under these conditions, when driving voltage Ve goes to zero, the voltage amplifier effectively disappears from the circuit. At that point, the top-most terminal of resistance Re in FIG. 2B is grounded as is the bottom-most terminal of resistance Res, and so resistances Re and Res are indeed connected in parallel as reflected in equation (6).

Electromagnetic transducers, such as LRAs or microspeakers, may have slow response times. FIG. 3 is a graph of an example response of an LRA, depicting an example driving signal to the LRA, a current through the LRA, and a back electromotive force (back EMF) of the LRA, wherein such back EMF may be proportional to the velocity of a moving element (e.g., coil or magnet) of the transducer. As shown in FIG. 3, the attack time of the back EMF may be slow as energy is transferred to the LRA, and some "ringing" of the back EMF may occur after the driving signal has ended as the mechanical energy stored in the LRA is discharged. In the context of a haptic LRA, such behavioral characteristic may result in a "mushy" feeling click or pulse, instead of a "crisp" tactile response. Thus, it may be desirable for an LRA to instead have a response similar to that shown in FIG. 4, in which there exists minimal ringing after the driving signal has ended, and which may provide a more "crisp" tactile response in a haptic context. Accordingly, it may be desirable to apply processing to a driving signal such that when the processed driving signal is applied to the transducer, the velocity or back EMF of the transducer more closely approaches that of FIG. 4. It is noted that by including FIG. 4 in this Background section, Applicant does not intend to admit the optimized waveforms of FIG. 4 as prior art.

To optimize performance of an LRA or other actuator to generate more desirable responses, a transducer driving system may need to apply optimized tuning parameters for a given actuator model, which traditionally may require implementation of costly factory calibration procedures. Accordingly, it may be desirable to reduce factory calibration by seamlessly performing actuator parameter measurements during system powering on or during use of an actuator without impacting user experience.

The human tactile system is particularly sensitive to frequencies in the range of 100-400 Hz. Accordingly, LRAs are often designed to have a resonant frequency in the range of 150 Hz-250 Hz. This resonance characteristic implies, in most cases, relatively large acceleration rise time. Additionally, after the LRA's mass is set in motion, decreasing the amplitude of the input voltage may not decrease the motion amplitude of the mass instantaneously. Instead, the motion of the mass will decay slowly. With the use of optimized tuning parameters, LRA algorithms may enable consistent acceleration across multiple LRA samples, reduce the ramp-up/braking time, and/or enhance an end-user experience of haptic effects.

SUMMARY

In accordance with the teachings of the present disclosure, the disadvantages and problems associated with determining parameters associated with an electromagnetic actuator may be reduced or eliminated.

In accordance with embodiments of the present disclosure, a method for estimating actuator parameters for an actuator, in-situ and in real-time, may include driving the actuator with a test signal imperceptible to a user of a device comprising the actuator during real-time operation of the device, measuring a voltage and a current associated with the actuator and caused by the test signal, determining one or more parameters of the actuator based on the voltage and the current, determining an actuator type of the actuator based on the one or more parameters, and controlling a playback signal to the actuator based on the actuator type.

In accordance with embodiments of the present disclosure, a system for estimating actuator parameters for an actuator, in-situ and in real-time, may include a test signal generator configured to generate a test signal imperceptible to a user of a device comprising the actuator in order to drive the actuator during real-time operation of the device and a measurement subsystem configured to measure a voltage and a current associated with the actuator and caused by the test signal, determine one or more parameters of the actuator based on the voltage and the current, determine an actuator type of the actuator based on the one or more parameters, and control a playback signal to the actuator based on the actuator type.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal will generally be an analog time varying voltage signal, for example, a time varying waveform.

Figure 5:
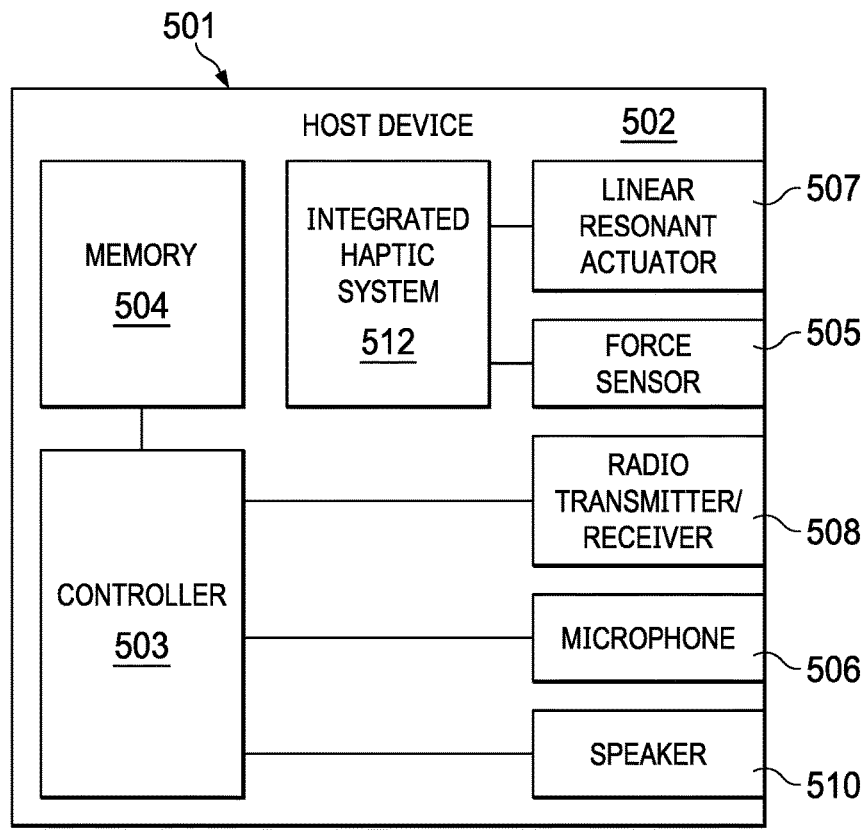
FIG. 5 illustrates a block diagram of selected components of an example mobile device, in accordance with embodiments of the present disclosure.

FIG. 5 illustrates a block diagram of selected components of an example host device 502, in accordance with embodiments of the present disclosure. As shown in FIG. 5, host device 502 may comprise an enclosure 501, a controller 503, a memory 504, a force sensor 505, a microphone 506, a linear resonant actuator 507, a radio transmitter/receiver 508, a speaker 510, and an integrated haptic system 512.

Enclosure 501 may comprise any suitable housing, casing, or other enclosure for housing the various components of host device 502. Enclosure 501 may be constructed from plastic, metal, and/or any other suitable materials. In addition, enclosure 501 may be adapted (e.g., sized and shaped) such that host device 502 is readily transported on a person of a user of host device 502. Accordingly, host device 502 may include but is not limited to a smart phone, a tablet computing device, a handheld computing device, a personal digital assistant, a notebook computer, a video game controller, or any other device that may be readily transported on a person of a user of host device 502.

Controller 503 may be housed within enclosure 501 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 503 interprets and/or executes program instructions and/or processes data stored in memory 504 and/or other computer-readable media accessible to controller 503.

Memory 504 may be housed within enclosure 501, may be communicatively coupled to controller 503, and may include any system, device, or apparatus configured to retain program instructions and/or data for a period of time (e.g., computer-readable media). Memory 504 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to host device 502 is turned off.

Microphone 506 may be housed at least partially within enclosure 501, may be communicatively coupled to controller 503, and may comprise any system, device, or apparatus configured to convert sound incident at microphone 506 to an electrical signal that may be processed by controller 503, wherein such sound is converted to an electrical signal using a diaphragm or membrane having an electrical capacitance that varies based on sonic vibrations received at the diaphragm or membrane. Microphone 506 may include an electrostatic microphone, a condenser microphone, an electret microphone, a microelectromechanical systems (MEMS) microphone, or any other suitable capacitive microphone.

Radio transmitter/receiver 508 may be housed within enclosure 501, may be communicatively coupled to controller 503, and may include any system, device, or apparatus configured to, with the aid of an antenna, generate and transmit radio-frequency signals as well as receive radio-frequency signals and convert the information carried by such received signals into a form usable by controller 503. Radio transmitter/receiver 508 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 510 may be housed at least partially within enclosure 501 or may be external to enclosure 501, may be communicatively coupled to controller 503, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

Force sensor 505 may be housed within enclosure 501, and may include any suitable system, device, or apparatus for sensing a force, a pressure, or a touch (e.g., an interaction with a human finger) and generating an electrical or electronic signal in response to such force, pressure, or touch. In some embodiments, such electrical or electronic signal may be a function of a magnitude of the force, pressure, or touch applied to the force sensor. In these and other embodiments, such electronic or electrical signal may comprise a general purpose input/output signal (GPIO) associated with an input signal to which haptic feedback is given. Force sensor 505 may include, without limitation, a capacitive displacement sensor, an inductive force sensor (e.g., a resistive-inductive-capacitive sensor), a strain gauge, a piezoelectric force sensor, force sensing resistor, piezoelectric force sensor, thin film force sensor, or a quantum tunneling composite-based force sensor. For purposes of clarity and exposition in this disclosure, the term "force" as used herein may refer not only to force, but to physical quantities indicative of force or analogous to force, such as, but not limited to, pressure and touch.

Linear resonant actuator 507 may be housed within enclosure 501, and may include any suitable system, device, or apparatus for producing an oscillating mechanical force across a single axis. For example, in some embodiments, linear resonant actuator 507 may rely on an alternating current voltage to drive a voice coil pressed against a moving mass connected to a spring. When the voice coil is driven at the resonant frequency of the spring, linear resonant actuator 507 may vibrate with a perceptible force. Thus, linear resonant actuator 507 may be useful in haptic applications within a specific frequency range. While, for the purposes of clarity and exposition, this disclosure is described in relation to the use of linear resonant actuator 507, it is understood that any other type or types of vibrational actuators (e.g., eccentric rotating mass actuators) may be used in lieu of or in addition to linear resonant actuator 507. In addition, it is also understood that actuators arranged to produce an oscillating mechanical force across multiple axes may be used in lieu of or in addition to linear resonant actuator 507. As described elsewhere in this disclosure, a linear resonant actuator 507, based on a signal received from integrated haptic system 512, may render haptic feedback to a user of host device 502 for at least one of mechanical button replacement and capacitive sensor feedback.

Integrated haptic system 512 may be housed within enclosure 501, may be communicatively coupled to force sensor 505 and linear resonant actuator 507, and may include any system, device, or apparatus configured to receive a signal from force sensor 505 indicative of a force applied to host device 502 (e.g., a force applied by a human finger to a virtual button of host device 502) and generate an electronic signal for driving linear resonant actuator 507 in response to the force applied to host device 502. Detail of an example integrated haptic system in accordance with embodiments of the present disclosure is depicted in FIG. 6.

Although specific example components are depicted above in FIG. 5 as being integral to host device 502 (e.g., controller 503, memory 504, force sensor 505, microphone 506, radio transmitter/receiver 508, speakers(s) 510), a host device 502 in accordance with this disclosure may comprise one or more components not specifically enumerated above. For example, although FIG. 5 depicts certain user interface components, host device 502 may include one or more other user interface components in addition to those depicted in FIG. 5 (including but not limited to a keypad, a touch screen, and a display), thus allowing a user to interact with and/or otherwise manipulate host device 502 and its associated components.

Figure 6:
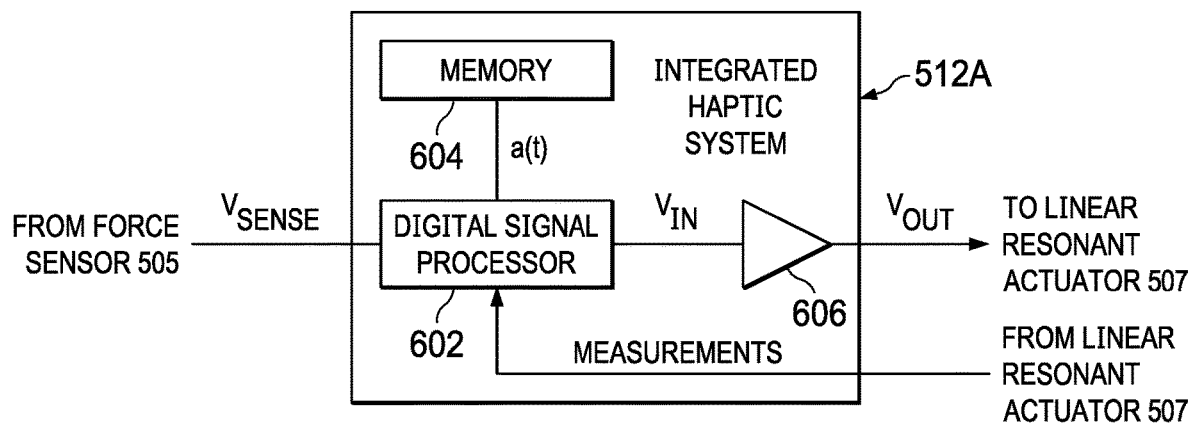
FIG. 6 illustrates a block diagram of selected components of an example integrated haptic system, in accordance with embodiments of the present disclosure.

FIG. 6 illustrates a block diagram of selected components of an example integrated haptic system 512A, in accordance with embodiments of the present disclosure. In some embodiments, integrated haptic system 512A may be used to implement integrated haptic system 512 of FIG. 5. As shown in FIG. 6, integrated haptic system 512A may include a digital signal processor (DSP) 602, a memory 604, and an amplifier 606.

DSP 602 may include any system, device, or apparatus configured to interpret and/or execute program instructions and/or process data. In some embodiments, DSP 602 may interpret and/or execute program instructions and/or process data stored in memory 604 and/or other computer-readable media accessible to DSP 602.

Memory 604 may be communicatively coupled to DSP 602, and may include any system, device, or apparatus configured to retain program instructions and/or data for a period of time (e.g., computer-readable media). Memory 604 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to host device 502 is turned off.

Amplifier 606 may be electrically coupled to DSP 602 and may comprise any suitable electronic system, device, or apparatus configured to increase the power of an input signal $Y_{IN}$ (e.g., a time-varying voltage or current) to generate an output signal $V_{OUT}$. For example, amplifier 606 may use electric power from a power supply (not explicitly shown) to increase the amplitude of a signal. Amplifier 606 may include any suitable amplifier class, including without limitation, a Class-D amplifier.

In operation, memory 604 may store one or more haptic playback waveforms. In some embodiments, each of the one or more haptic playback waveforms may define a haptic response a(t) as a desired acceleration of a linear resonant actuator (e.g., linear resonant actuator 507) as a function of time. DSP 602 may be configured to receive a force signal VsENsE indicative of force applied to force sensor 505. Either in response to receipt of force signal VsENsE indicating a sensed force or independently of such receipt, DSP 602 may retrieve a haptic playback waveform from memory 604 and process such haptic playback waveform to determine a processed haptic playback signal $Y_{IN}$. In embodiments in which amplifier 606 is a Class D amplifier, processed haptic playback signal $Y_{IN}$ may comprise a pulse-width modulated signal. In response to receipt of force signal VSENSE indicating a sensed force, DSP 602 may cause processed haptic playback signal $Y_{IN}$ to be output to amplifier 606, and amplifier 606 may amplify processed haptic playback signal $Y_{IN}$ to generate a haptic output signal $V_{OUT}$ for driving linear resonant actuator 507.

In some embodiments, integrated haptic system 512A may be formed on a single integrated circuit, thus enabling lower latency than existing approaches to haptic feedback control. By providing integrated haptic system 512A as part of a single monolithic integrated circuit, latencies between various interfaces and system components of integrated haptic system 512A may be reduced or eliminated.

Figure 7:
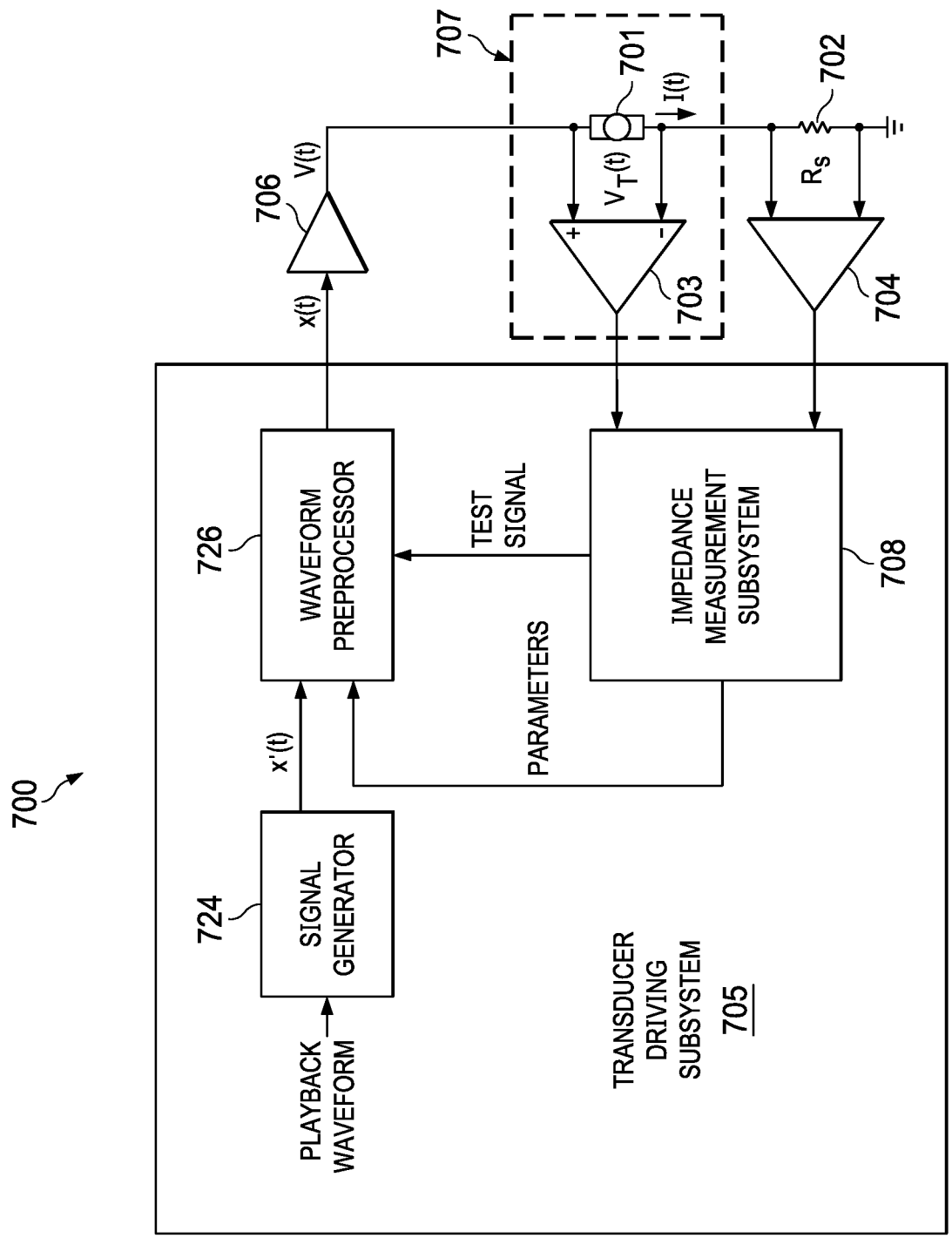
FIG. 7 illustrates selected components of an example system comprising an electromagnetic load, in accordance with embodiments of the present disclosure.

FIG. 7 illustrates selected components of an example system 700 comprising an electromagnetic load 701, in accordance with embodiments of the present disclosure. System 700 may include or be integral to, without limitation, a mobile device, home application, vehicle, and/or any other system, device, or apparatus that includes a human-machine interface. Electromagnetic load 701 may include any suitable load with a complex impedance, including without limitation, a haptic transducer, a loudspeaker, a microspeaker, a piezoelectric transducer, a voice-coil actuator, a solenoid, or other suitable transducer.

In operation, a signal generator 724 of a transducer driving subsystem 705 of system 700 may generate a raw transducer driving signal x'(t) (which, in some embodiments, may be a waveform signal, such as a haptic waveform signal or audio signal). Raw transducer driving signal x'(t) may be generated based on a desired playback waveform received by signal generator 724.

Raw transducer driving signal x'(t) may be received by waveform preprocessor 726 which may modify raw transducer driving signal x'(t) based on one or more parameters generated by impedance measurement subsystem 708 wherein such one or more parameters may be associated with electromagnetic load 701.

Processed transducer driving signal x(t) may in turn be amplified by amplifier 706 to generate a driving signal V(t) for driving electromagnetic load 701. Responsive to driving signal V(t), a sensed terminal voltage $V_T(t)$ of electromagnetic load 701 may be sensed by a terminal voltage sensing block 707, for example a volt-meter, and converted to a digital representation by a first analog-to-digital converter (ADC) 703. Similarly, sensed current I(t) may be converted to a digital representation by a second ADC 704. Current I(t) may be sensed across a shunt resistor 702 having resistance $R_s$ coupled to a terminal of electromagnetic load 701.

As shown in FIG. 7, transducer driving subsystem 705 may include an impedance measurement subsystem 708 that may estimate an impedance of electromagnetic load 701, including without limitation, DC resistance Re and coil inductance Le of electromagnetic load 701. Based on such measurements, impedance measurement subsystem 708 may communicate such parameters and/or any other suitable parameters (e.g., mechanical impedance parameters Res, Cmes, and Lces) to waveform preprocessor 726. Based on such parameters, waveform preprocessor 726 may modify raw transducer driving signal x'(t) in a manner intended to optimize performance of electromagnetic load 701 (e.g., modify driving or braking of electromagnetic load to enhance human perception of crispness of a haptic effect).

Examples of approaches for estimating one or more components of the electrical and/or mechanical impedances of electromagnetic load 701 are described in, without limitation, U.S. patent application Ser. No. 16/816,790 filed Mar. 12, 2020 and entitled "Methods and Systems for Improving Transducer Dynamics;" U.S. Pat. application Ser. No. 16/816,833 filed Mar. 12, 2020 and entitled "Methods and Systems for Estimating Transducer Parameters;" U.S. patent application Ser. No. 16/842,482 filed Apr. 7, 2020 and entitled "Thermal Model of Transducer for Thermal Protection and Resistance Estimation;" U.S. patent application Ser. No. 16/369,556 filed Mar. 29, 2019 and entitled "Driver Circuitry;" and U.S. patent application Ser. No. 17/497,110 filed Oct. 8, 2021 and entitled "Systems and Methods for Sensing Displacement of an Electromechanical Transducer;" all of which are incorporated by reference herein in their entireties.

Figure 1:
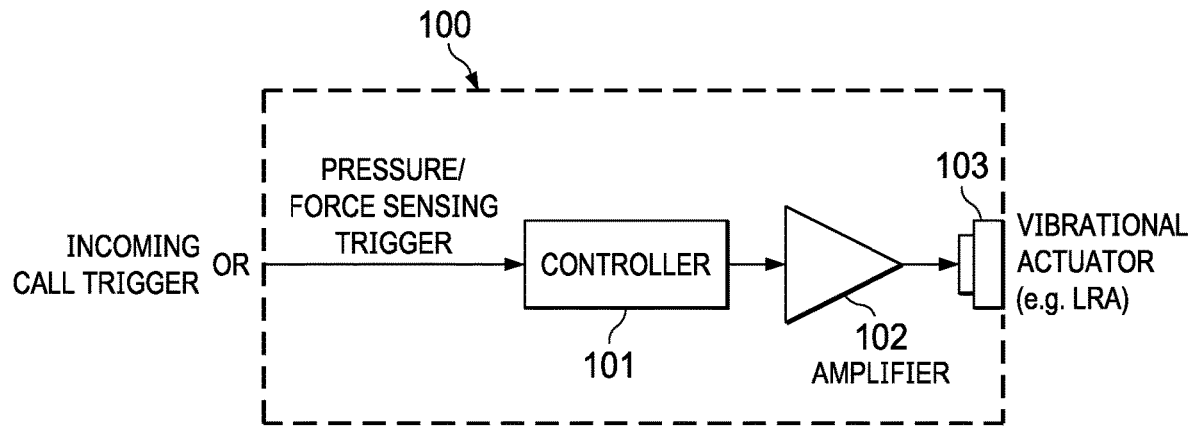
FIG. 1 illustrates an example of a vibro-haptic system in a device, as is known in the art.
Figure 2A:
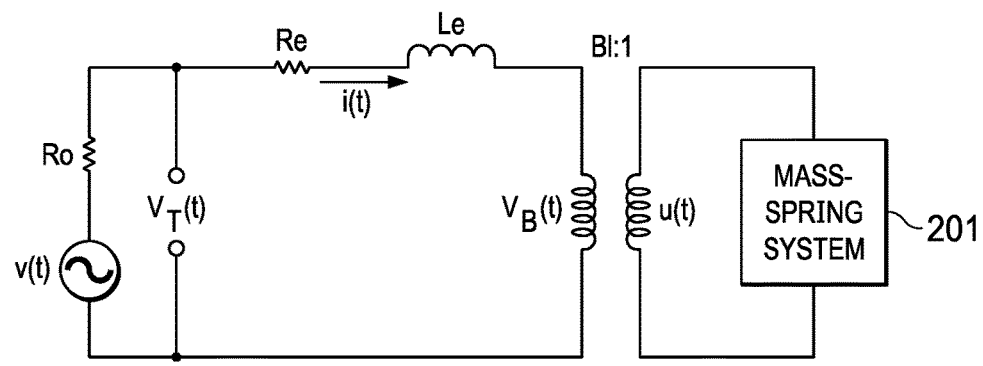
FIGS. 2A and 2B each illustrate an example of a Linear Resonant Actuator (LRA) modelled as a linear system, as is known in the art.
Figure 2B:
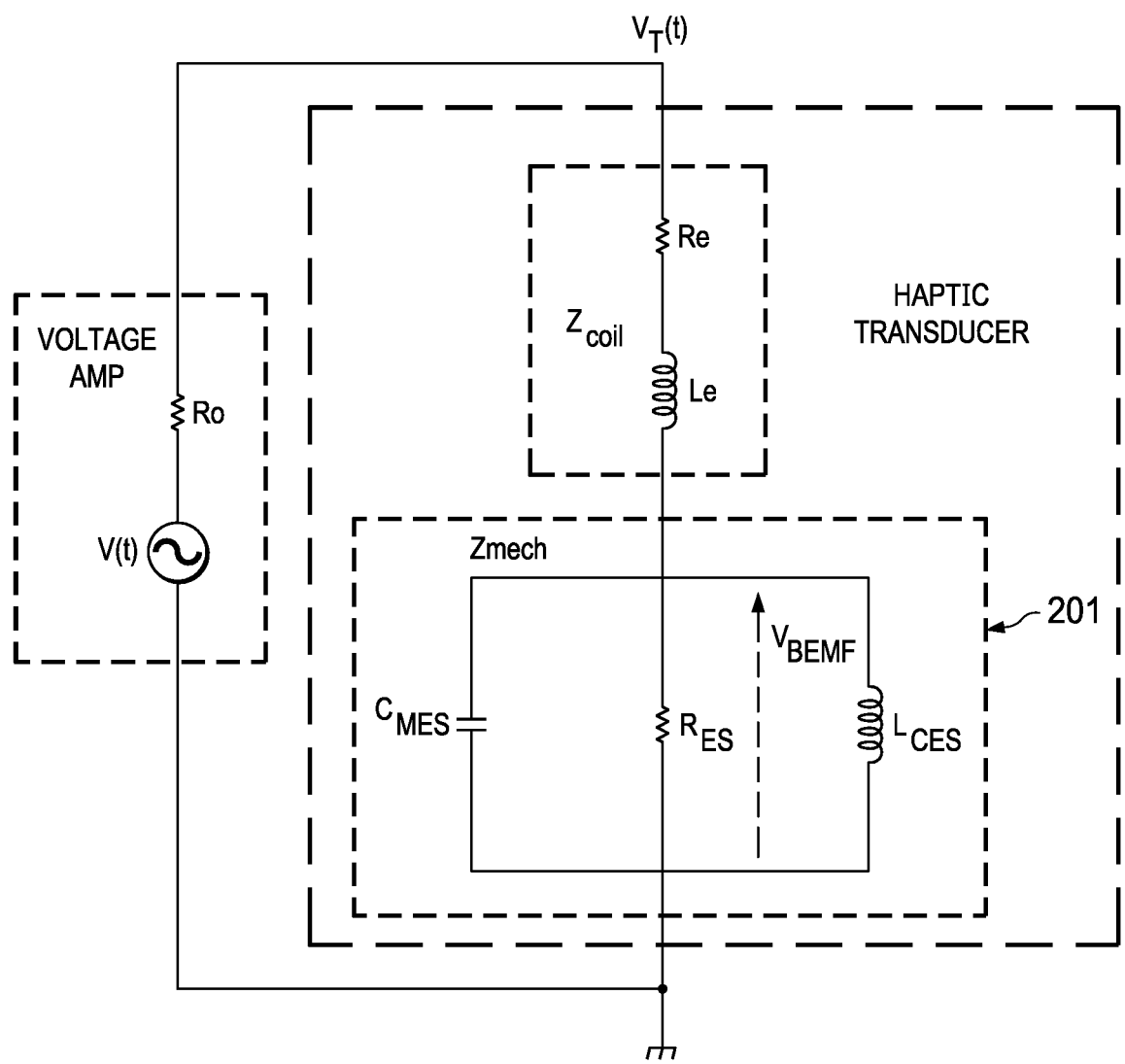
Figure 3:
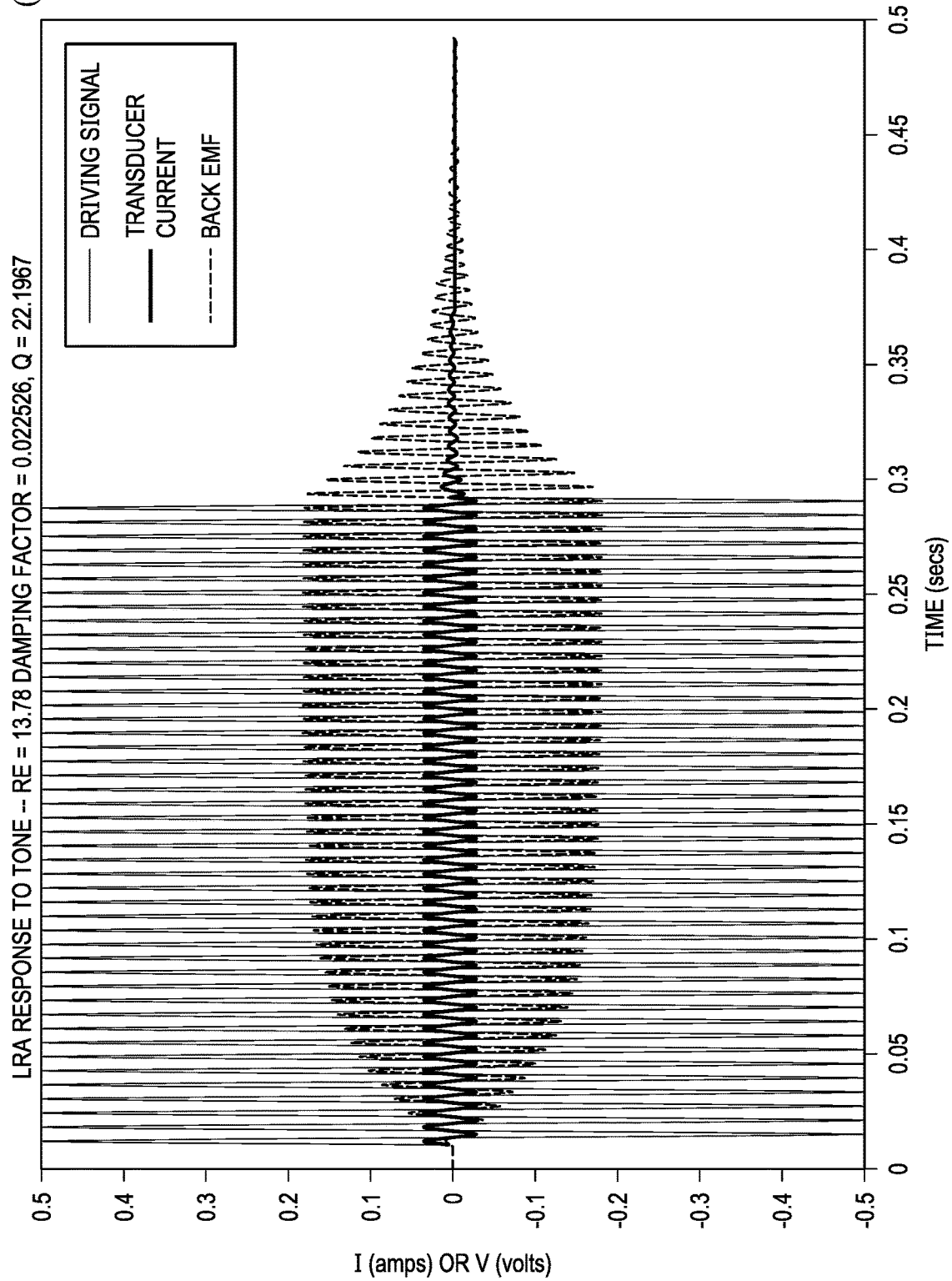
FIG. 3 illustrates a graph of example waveforms of an electromagnetic load, as is known in the art.
Figure 4:
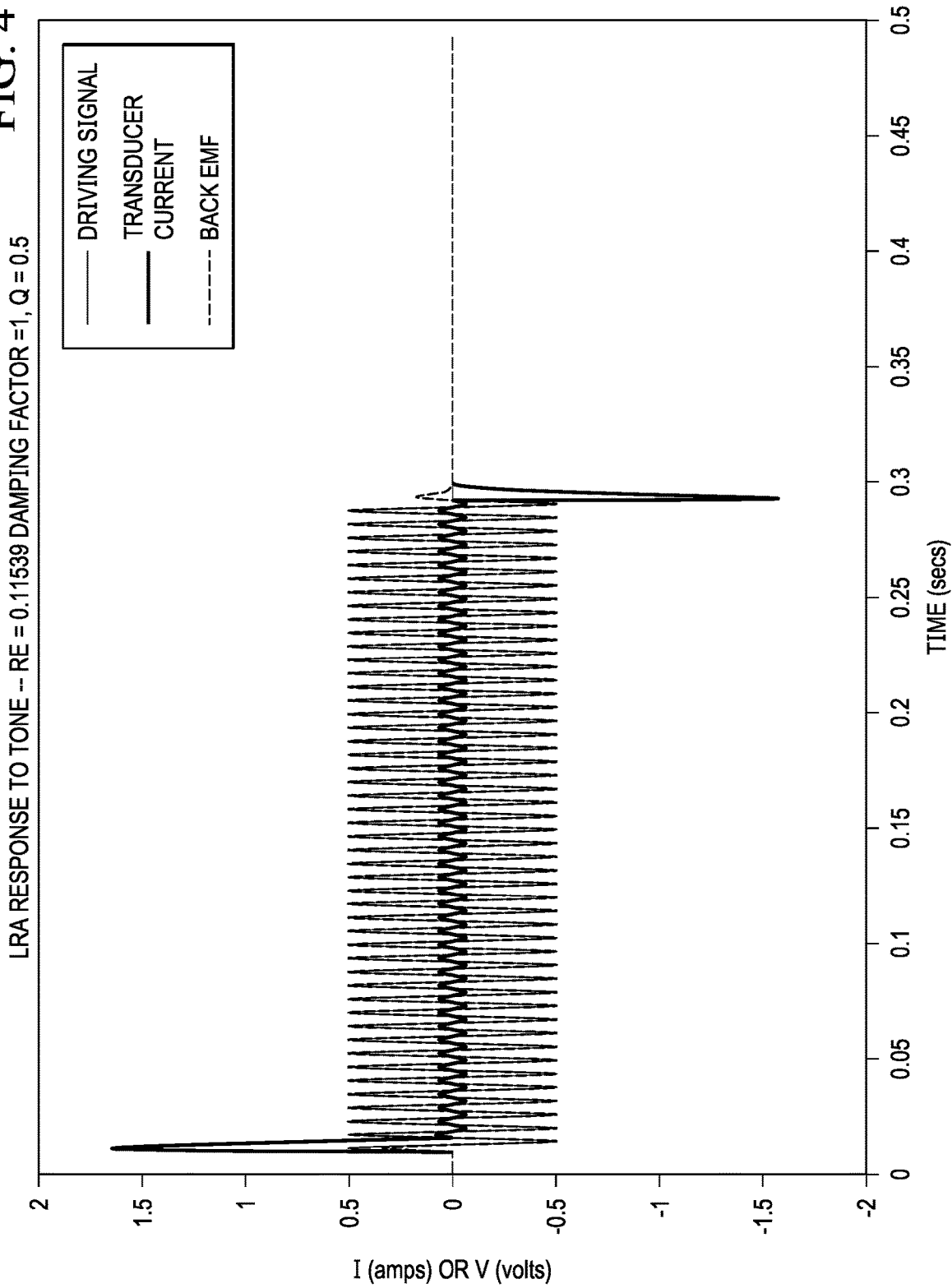
FIG. 4 illustrates a graph of desirable example waveforms of an electromagnetic load, in accordance with embodiments of the present disclosure.

For example, referring to FIG. 2B, both the speed and the position of the moving mass of the actuator may be captured by the back-EMF Vbemf (going forward, referred as $V_B$) and $I_L$ respectively (e.g., back-EMF $V_B$ is proportional to the velocity and current $I_L$ is proportional to the position of the moving mass). The linear state space model of the transducer model illustrated in FIG. 2B is represented by the following equations:

$$\begin{bmatrix} \dot{I} \\ \dot{I_L} \\ \dot{V_B} \end{bmatrix} = \begin{bmatrix} -Re/Le & 0 & -1/Le \\ 0 & 0 & 1/Lces \\ 1/Cmes & -1/Cmes & 1/Res \cdot Cmes \end{bmatrix} \begin{bmatrix} I \\ I_L \\ V_B \end{bmatrix} + \begin{bmatrix} 1/Le \\ 0 \\ 0 \end{bmatrix} Ve$$

$$y = \begin{bmatrix} 1 & 0 & 0 \\ 0 & 0 & 1 \end{bmatrix} \begin{bmatrix} I \\ I_L \\ V_B \end{bmatrix}$$

where voltage Ve of the transducer model illustrated in FIG. 2B may be given by sensed terminal voltage $V_T(t)$. Accordingly, impedance measurement subsystem 708 may provide estimation of one or more of the internal parameters of the actuator, including DC resistance Re, coil inductance Le, a parallel mechanical resistance Res, a parallel capacitance Cmes, and/or a parallel inductance Lees, if measurements of current and input voltage exciting the frequency regions of interest are available.

To estimate such impedance parameters in-situ, in operation, impedance measurement subsystem 708 may generate a test signal (e.g., a pilot tone signal), and waveform preprocessor 726 may either combine such test signal with raw transducer driving signal x'(t) to generate processed transducer driving signal x(t), or may mute raw transducer driving signal x'(t) and generate the test signal as processed transducer driving signal x(t). Such test signal may have a transducer driving signal that has a human non-perceptible duration, a human non-perceptible amplitude, and/or a frequency not typically used by a final application of electromagnetic load 701 to stimulate electromagnetic load 701 (e.g., a frequency much different than the resonant frequency of electromagnetic load 701). Accordingly, the test signal may be imperceptible to a user of system 700 when system 700 is being operated and used in real time. For example, a non-perceptible duration may be approximately 5 milliseconds. As another example, a non-perceptible amplitude may be between approximately 170 millivolts and approximately 330 millivolts. A frequency not typically used by a final application of electromagnetic load 701 to stimulate electromagnetic load 701 may depend on the type of electromagnetic load 701 and may vary based on the type of electromagnetic load 701.

Further, impedance measurement subsystem 708 may measure sensed terminal voltage $V_T(t)$ and sensed current I(t) caused by driving the test signal to electromagnetic load 701. In addition, impedance measurement subsystem 708 may estimate parameters of electromagnetic load 701 (e.g., DC resistance Re, coil inductance Le, a parallel mechanical resistance Res, a parallel capacitance Cmes, and/or a parallel inductance Lees) and communicate such parameters to waveform preprocessor 726.

In turn, waveform preprocessor 726 may determine a type of electromagnetic load 701 present in system 700 and based thereon, perform optimized control of raw transducer driving signal x'(t) to generate processed transducer driving signal x(t).

Figure 8:
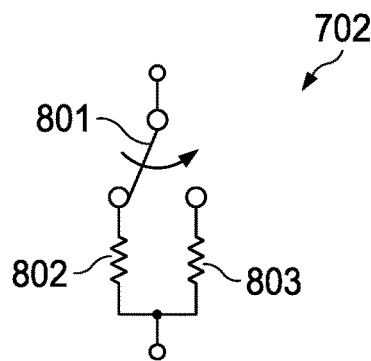
FIG. 8 illustrates a circuit diagram of an example implementation of a sense resistor for measuring current, in accordance with embodiments of the present disclosure.

FIG. 8 illustrates a circuit diagram of an example implementation of sense resistor 702, in accordance with embodiments of the present disclosure. As shown in FIG. 8, sense resistor 702 may be implemented using two selectable resistors 802 and 803 with a switch 801 for selecting between usage of resistor 802 and resistor 803. A resistance of resistor 802 may be significantly higher than a resistance of resistor 803.

During playback of the test signal by impedance measurement subsystem 708 and waveform preprocessor 726, a tolerance to voltage drops across sense resistor 702 may be higher, meaning that a resistance value $R_s$ may be desirable only while playing the test signal to increase the signal-to-noise ratio of the measurement of sensed current I(t) caused using the same voltage measurement device (e.g., second ADC 704) coupled to the terminals of sense resistor 702. Accordingly, system 700 may operate in two different modes: a) a characterization mode in which larger resistor 802 is selected and impedance measurement subsystem 708 measures sensed current I(t); and b) an activation mode in which smaller resistor 803 is selected (e.g., to have a smaller effect on desired haptic operation of electromagnetic load 701) and intended, human-perceptible waveforms are driven to electromagnetic load 701. Although not shown in detail in the figures, impedance measurement subsystem 708 and/or another portion of transducer driving subsystem 705 may generate a control signal for operating switch 801 to select between resistor 802 and resistor 803.

Figure 9:
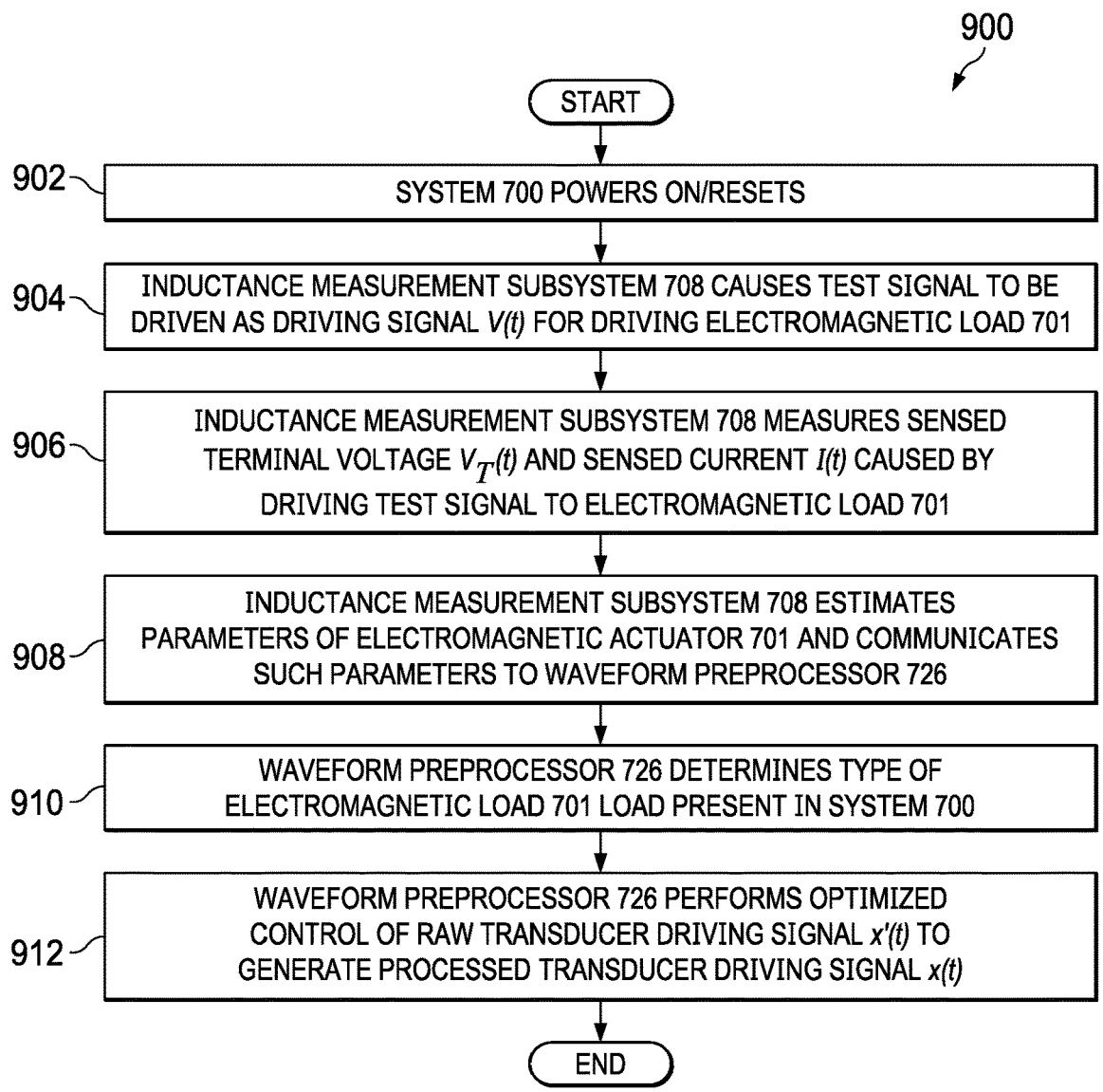
FIG. 9 illustrates a flow chart of an example method for in-system estimation of actuator parameters and compensation therefor, in accordance with embodiments of the present disclosure.

FIG. 9 illustrates a flow chart of an example method for in-system estimation of actuator parameters and compensation therefor, in accordance with embodiments of the present disclosure. According to certain embodiments, method 900 may begin at step 902. As noted above, teachings of the present disclosure may be implemented in a variety of configurations of system 700. As such, the preferred initialization point for method 900 and the order of the steps comprising method 900 may depend on the implementation chosen.

At step 902, system 700 may power on or reset. At step 904, after loading of firmware for implementing all or a portion of transducer driving subsystem 705, system 700 may enter the characterization mode and impedance measurement subsystem 708 may cause a test signal to be driven as driving signal V(t) for driving electromagnetic load 701. At step 906, impedance measurement subsystem 708 may measure sensed terminal voltage $V_T(t)$ and sensed current I(t) caused by driving the test signal to electromagnetic load 701. At step 908, impedance measurement subsystem 708 may estimate parameters of electromagnetic actuator 701 (e.g., DC resistance Re, coil inductance Le, a parallel mechanical resistance Res, a parallel capacitance Cmes, and/or a parallel inductance Lees) and communicate such parameters to waveform preprocessor 726.

At step 910, waveform preprocessor 726 may determine a type of electromagnetic load 701 present in system 700. At step 912, system 700 may enter the activation mode in which waveform preprocessor 726 may perform optimized control of raw transducer driving signal x'( ) to generate processed transducer driving signal x(t).

Although FIG. 9 discloses a particular number of steps to be taken with respect to method 900, it may be executed with greater or fewer steps than those depicted in FIG. 9. In addition, although FIG. 9 discloses a certain order of steps to be taken with respect to method 900, the steps comprising method 900 may be completed in any suitable order.

Method 900 may be implemented using transducer driving subsystem 705, components thereof or any other system operable to implement method 900. In certain embodiments, method 900 may be implemented partially or fully in software and/or firmware embodied in computer-readable media.

Although the foregoing discusses application to a linear electromagnetic load, it is understood that systems and methods similar or identical to those disclosed may be applied to other linear or non-linear systems.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for estimating, in-situ and in real-time, actuator parameters for an actuator, the method comprising:
   driving the actuator with a test signal imperceptible to a user of a device comprising the actuator during real-time operation of the device;
   measuring a voltage and a current associated with the actuator and caused by the test signal;
   determining one or more parameters of the actuator based on the voltage and the current;
   determining an actuator type of the actuator based on the one or more parameters; and
   controlling a playback signal to the actuator based on the actuator type.

2. The method of claim 1, wherein the one or more parameters comprise mechanical impedance parameters of the actuator.

3. The method of claim 1, wherein the one or more parameters comprise electrical impedance parameters of the actuator.

4. The method of claim 1, wherein the test signal has a non-perceptible duration.

5. The method of claim 4, wherein the non-perceptible duration is less than approximately 5 milliseconds.

6. The method of claim 1, wherein the test signal has a non-perceptible amplitude.

7. The method of claim 6, wherein the non-perceptible amplitude is between approximately 170 millivolts and approximately 130 millivolts.

8. The method of claim 1, wherein the test signal has a frequency significantly different than a resonant frequency of the actuator.

9. The method of claim 1, wherein measuring the current comprises measuring a sense voltage across terminals of a sense resistor in series with the actuator.

10. The method of claim 9, further comprising operating the device in a plurality of modes comprising:
    a characterization mode in which the sense resistor has a first resistance and in which the current is measured; and
    an activation mode in which the sense resistor has a second resistance significantly smaller than the first resistance.

11. A system for estimating, in-situ and in real-time, actuator parameters for an actuator, the system comprising:
    a test signal generator configured to generate a test signal imperceptible to a user of a device comprising the actuator in order to drive the actuator during real-time operation of the device; and
    a measurement subsystem configured to:
        measure a voltage and a current associated with the actuator and caused by the test signal;
        determine one or more parameters of the actuator based on the voltage and the current;
        determine an actuator type of the actuator based on the one or more parameters; and
        control a playback signal to the actuator based on the actuator type.

12. The system of claim 11, wherein the one or more parameters comprise mechanical impedance parameters of the actuator.

13. The system of claim 11, wherein the one or more parameters comprise electrical impedance parameters of the actuator.

14. The system of claim 11, wherein the test signal has a non-perceptible duration.

15. The system of claim 14, wherein the non-perceptible duration is less than approximately 5 milliseconds.

16. The system of claim 11, wherein the test signal has a non-perceptible amplitude.

17. The system of claim 16, wherein the non-perceptible amplitude is between approximately 170 millivolts and approximately 130 millivolts.

18. The system of claim 11, wherein the test signal has a frequency significantly different than a resonant frequency of the actuator.

19. The system of claim 11, wherein measuring the current comprises measuring a sense voltage across terminals of a sense resistor in series with the actuator.

20. The system of claim 19, the measurement system further configured to operate the device in a plurality of modes comprising:
    a characterization mode in which the sense resistor has a first resistance and in which the current is measured; and
    an activation mode in which the sense resistor has a second resistance significantly smaller than the first resistance.

* * * * *

UNITED STATES PATENT AND TRADEMARK OFFICE
CERTIFICATE OF CORRECTION

PATENT NO. : 11,933,822 B2
APPLICATION NO. : 17/574188
DATED : March 19, 2024
INVENTOR(S) : Reynaga et al.

It is certified that error appears in the above-identified patent and that said Letters Patent is hereby corrected as shown below:

In the Claims

1. In Column 13, Line 33, in Claim 7, delete "130 millivolts," and insert -- 330 millivolts --, therefor.

2. In Column 14, Line 30, in Claim 17, delete "130 millivolts" and insert -- 330 millivolts --, therefor.

Signed and Sealed this
Twenty-second Day of October, 2024

Katherine Kelly Vidal
*Director of the United States Patent and Trademark Office*